United States Patent
Bierman et al.

[19]

[11] Patent Number: 6,133,152
[45] Date of Patent: Oct. 17, 2000

[54] CO-ROTATING EDGE RING EXTENSION FOR USE IN A SEMICONDUCTOR PROCESSING CHAMBER

[75] Inventors: Benjamin Bierman, Milpitas; Meredith J. Williams, Santa Clara; David S. Ballance, Cupertino; Brian Haas; Paul Deaton, both of San Jose; James V. Tietz, Fremont, all of Calif.

[73] Assignee: Applied Materials, Inc., Santa Clara, Calif.

[21] Appl. No.: 08/880,194

[22] Filed: May 16, 1997

[51] Int. Cl.[7] .................................................. H01L 21/302
[52] U.S. Cl. ........................ 438/706; 118/730; 156/345; 216/58
[58] Field of Search ..................................... 118/729, 730, 118/728; 156/345; 438/943, 942, 706; 216/58

[56] References Cited

U.S. PATENT DOCUMENTS

| | | | |
|---|---|---|---|
| 5,820,686 | 10/1998 | Moore | 118/730 |
| 5,851,299 | 12/1998 | Cheng et al. | 118/729 |
| 5,884,412 | 3/1999 | Tietz et al. | 34/58 |

*Primary Examiner*—Richard Bueker
*Assistant Examiner*—Erin Fieler
*Attorney, Agent, or Firm*—Fish & Richardson

[57] ABSTRACT

An apparatus to isolate a rotating frame in a processing chamber, comprising: a support cylinder rotatably extending from the rotating frame; and a co-rotating edge ring extension extending from the support cylinder to at least one of substantially thermally, optically and mechanically isolate the region above the co-rotating edge ring extension from the region below the co-rotating edge ring extension.

22 Claims, 6 Drawing Sheets

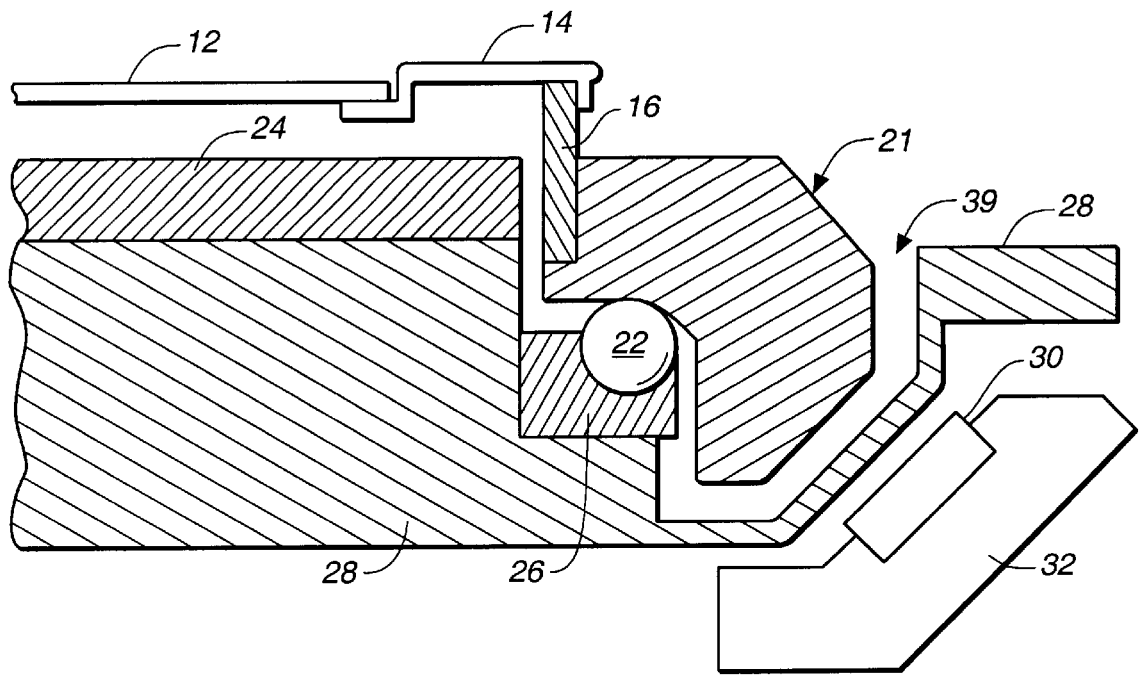
FIG._1A
*(PRIOR ART)*
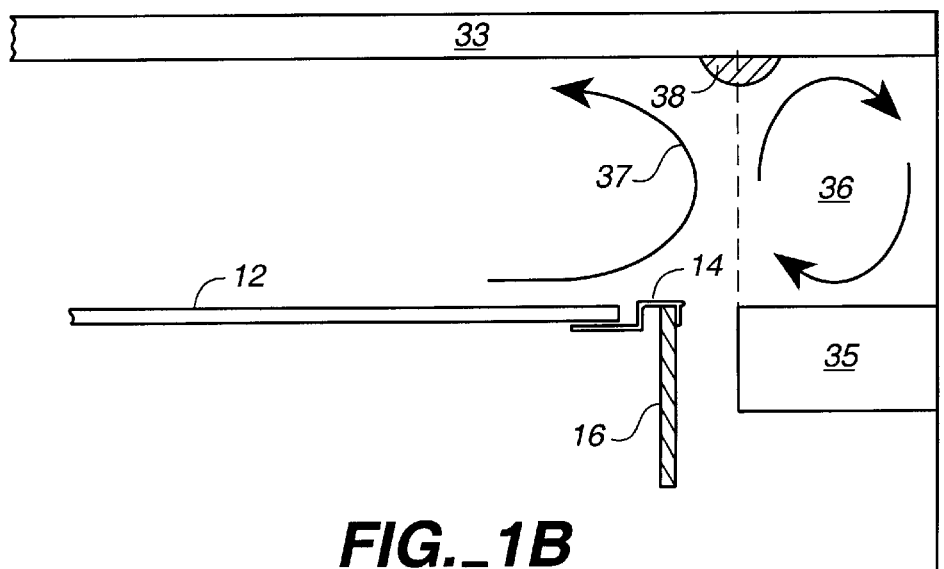
FIG._1B
*(PRIOR ART)*

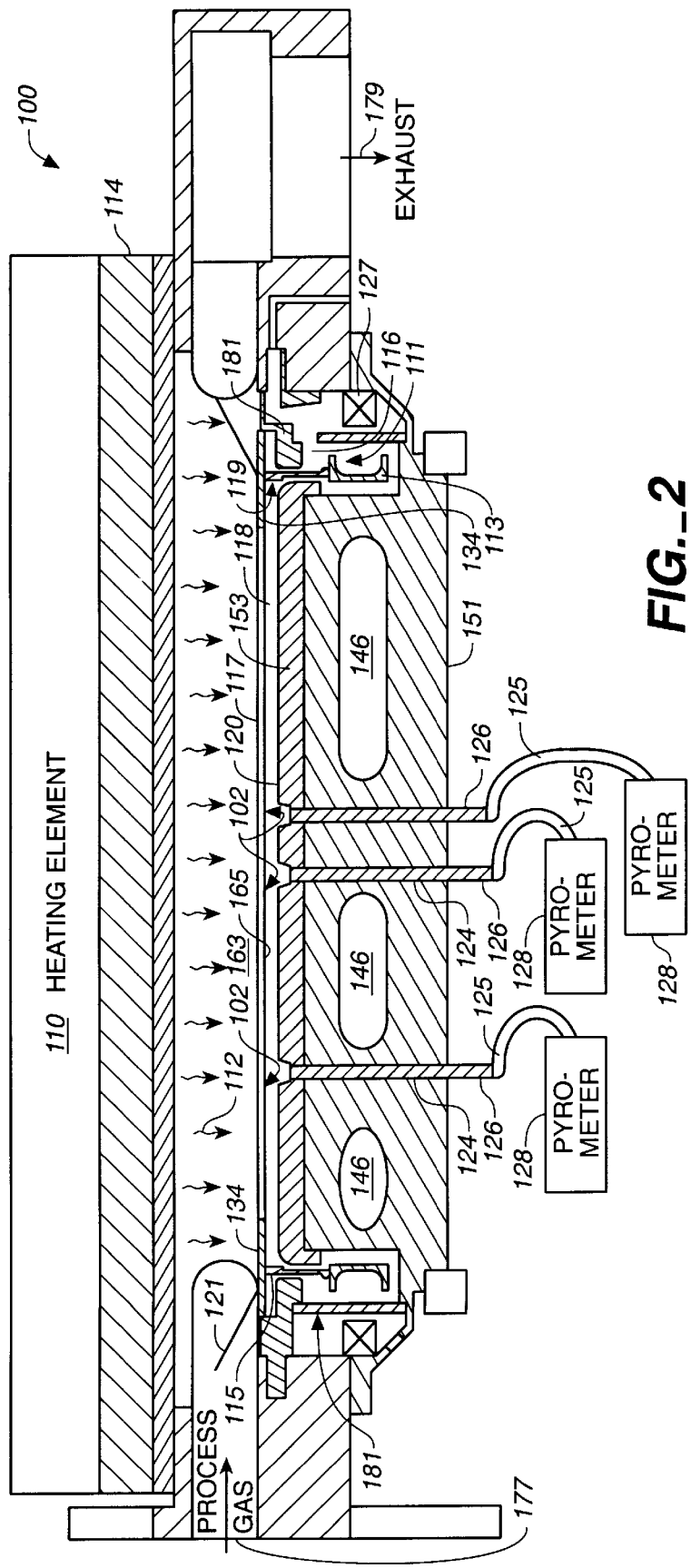
FIG._2

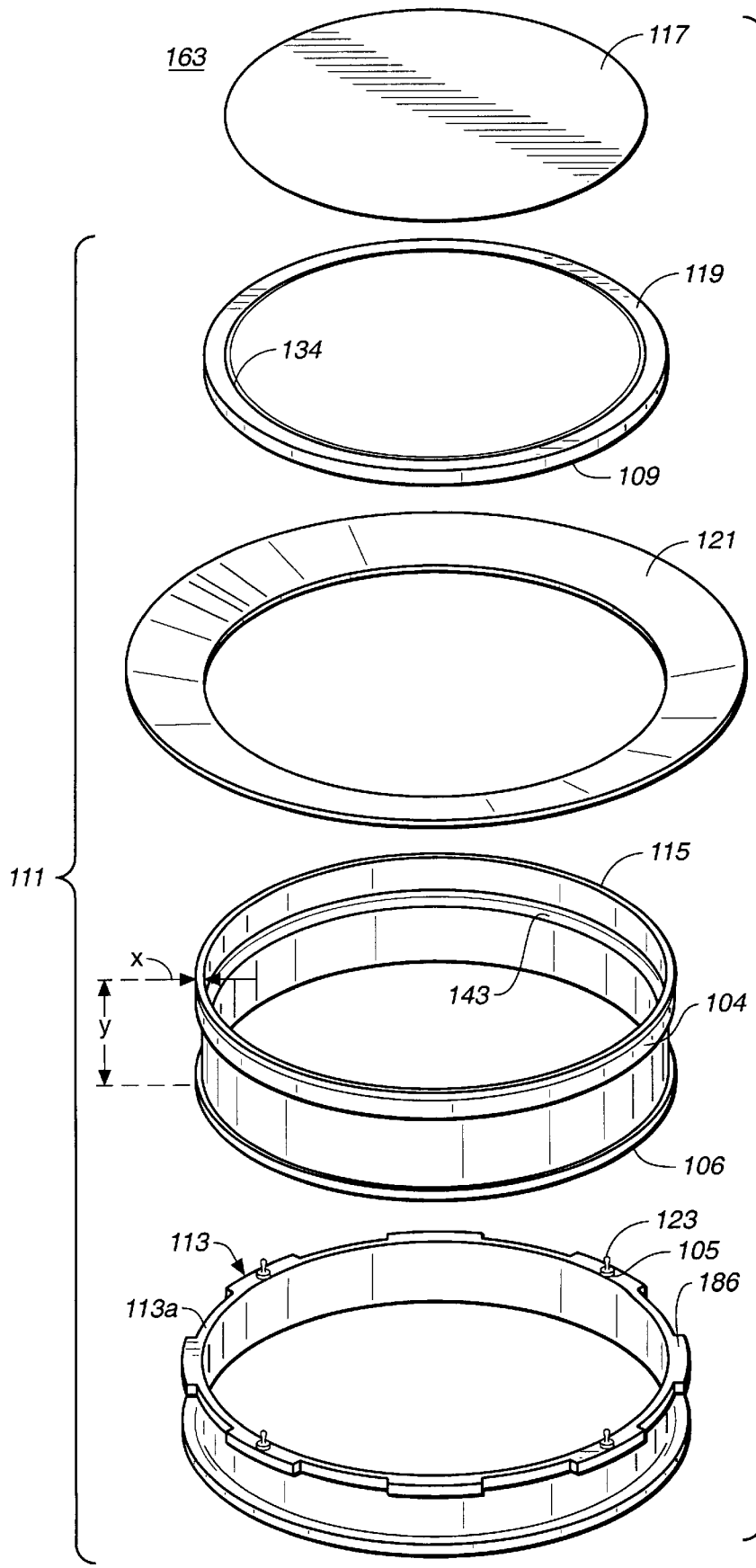

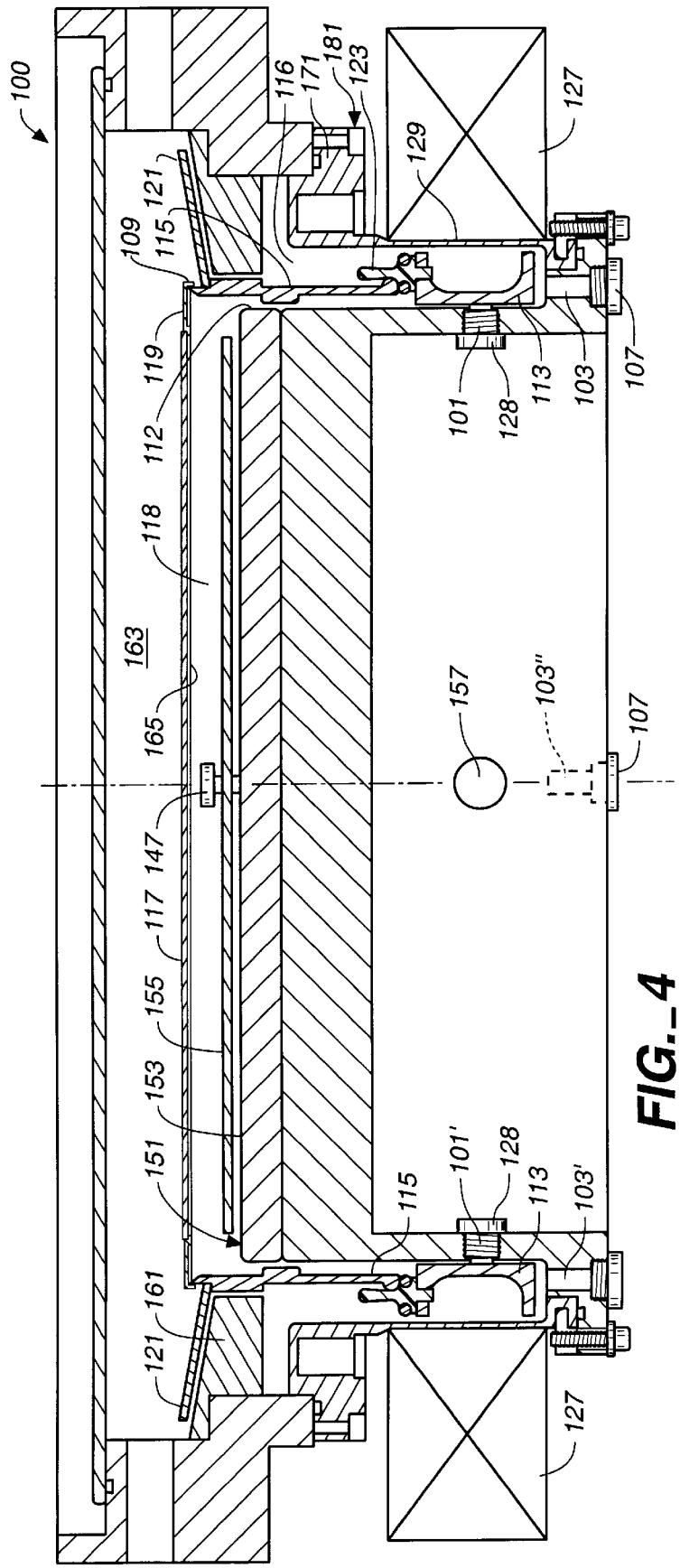
FIG._4

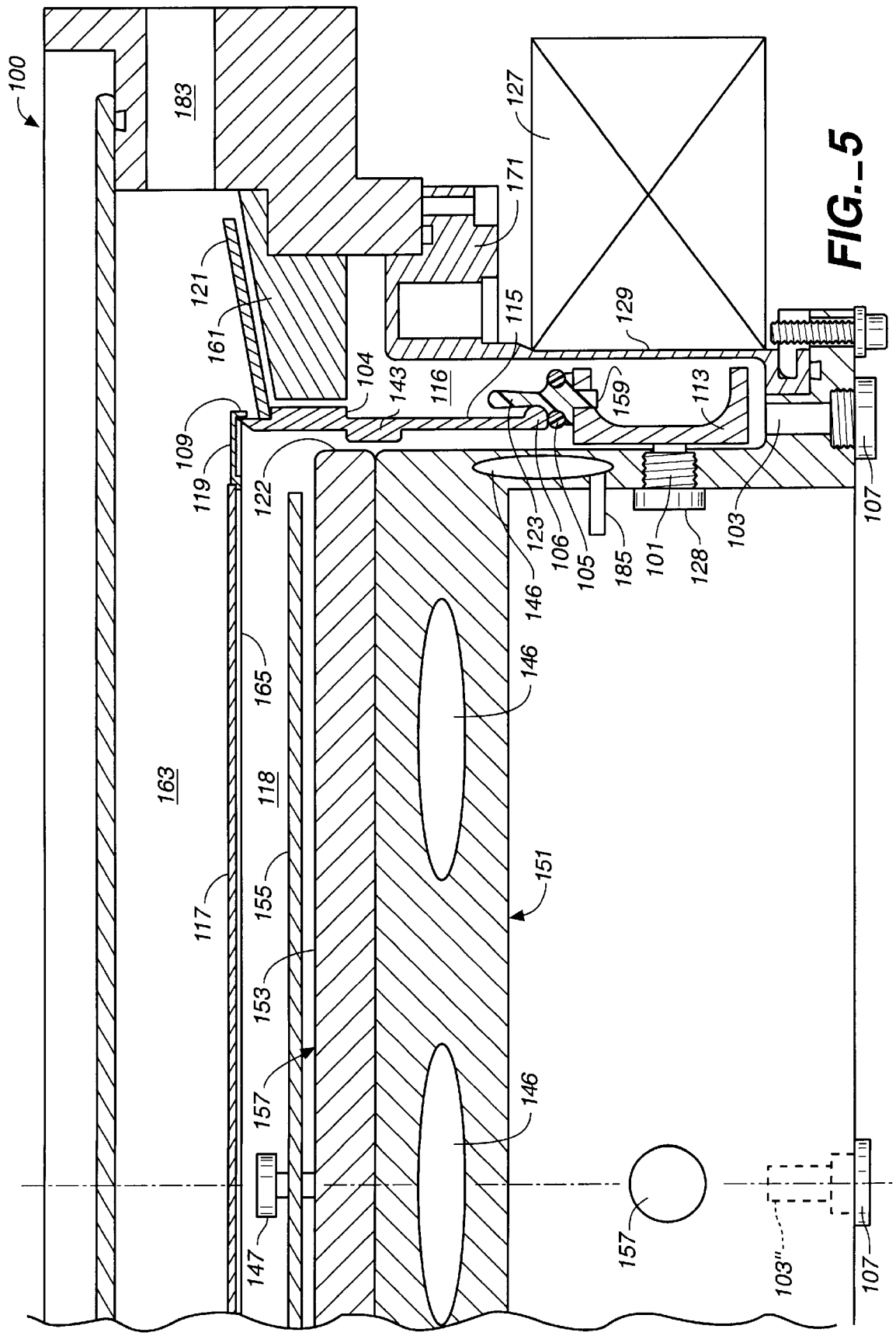
FIG._5

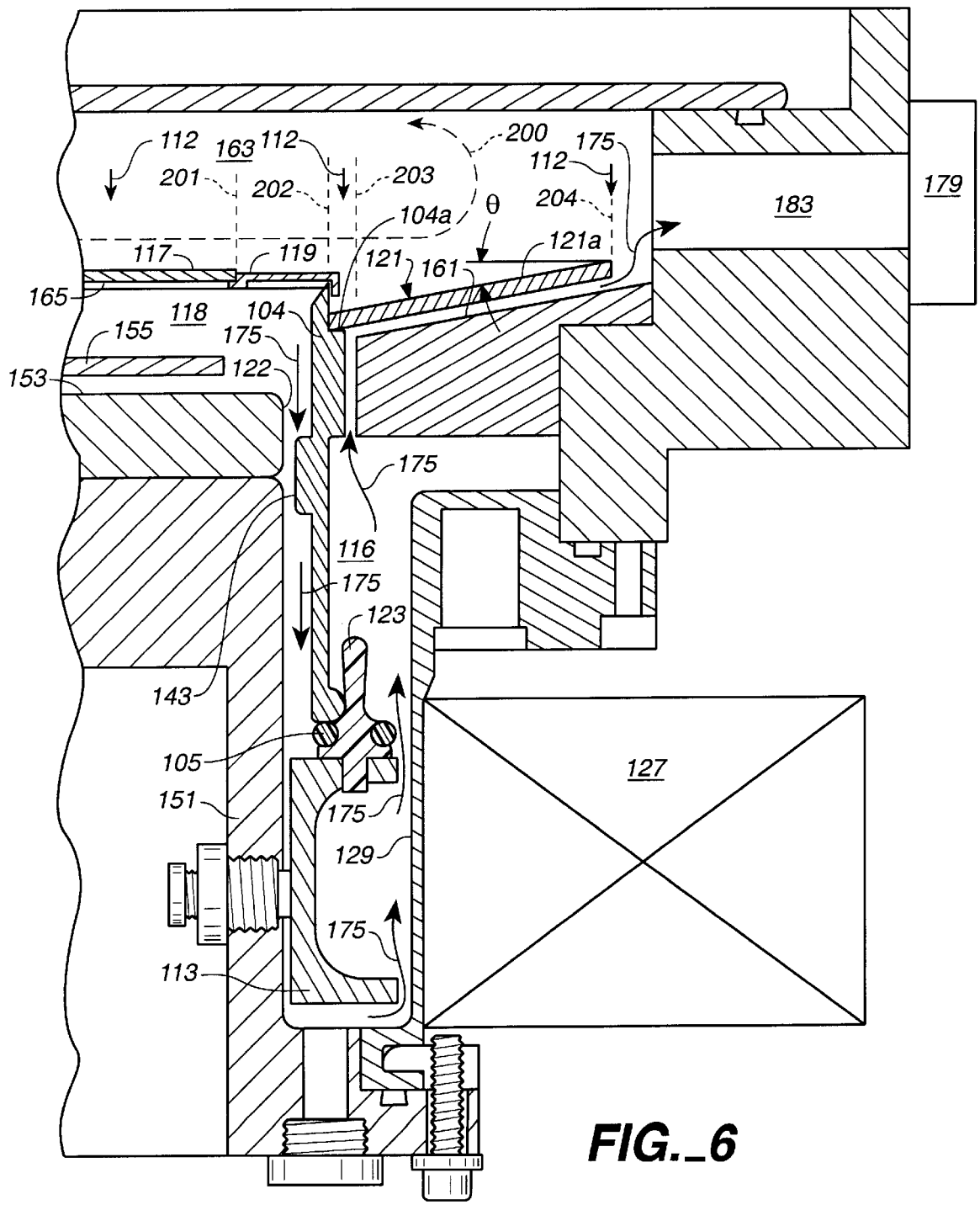
FIG._6

CO-ROTATING EDGE RING EXTENSION FOR USE IN A SEMICONDUCTOR PROCESSING CHAMBER

BACKGROUND OF THE INVENTION

The present invention relates to semiconductor processing chambers, and more particularly, to a rapid thermal processing (RTP) chamber having a barrier for protecting rotational components and other sensitive components of the chamber from the effects of hot process gases. The barrier also provides beneficial features relating to gas flow.

RTP technologies have been developed to increase manufacturing throughput of wafers while minimizing their handling. The types of wafers referred to here include those for ultra-large scale integrated (ULSI) circuits. RTP refers to several different processes, including rapid thermal annealing (RTA), rapid thermal cleaning (RTC), rapid thermal chemical vapor deposition (RTCVD), rapid thermal oxidation (RTO), and rapid thermal nitridation (RTN).

In one RTP process, wafers are loaded into a processing chamber at a temperature of several hundred degrees Celsius (°C.) in a nitrogen ($N_2$) gas ambient atmosphere. The temperature of the wafer is ramped to a process temperature, usually in the range of about 850° C. to 1200° C. The temperature is raised using a large number of halogen lamps which radiatively heat the wafer. The temperature stabilizes over a pre-set time period. Reactive gases may be introduced before, during or after the temperature ramp. For example, oxygen may be introduced for growth of silicon dioxide ($SiO_2$).

It is desirable to obtain temperature uniformity in the substrate during processing. Temperature uniformity provides uniform process variables over the substrate (e.g., layer thickness, resistivity, and etch depth) for various process steps including film deposition, oxide growth and etching. In addition, temperature uniformity in the substrate is necessary to prevent thermal stress-induced wafer damage such as warpage, defect generation and slip. This type of damage is caused by thermal gradients which are minimized by temperature uniformity. The wafer often cannot tolerate even small temperature differentials during high temperature processing. For example, if the temperature differential is allowed to rise above 1–2° C./centimeter (cm) at 1200° C., the resulting stress is likely to cause slip in the silicon crystal. The resulting slip planes will destroy any devices through which they pass. To achieve this level of temperature uniformity, reliable real-time, multi-point temperature measurements for closed-loop temperature control are necessary.

One way of achieving temperature uniformity is by rotating the substrate during processing. This removes the temperature dependence along the azimuthal degree-of-freedom. This dependence is removed since, as the axis of the substrate is collinear with the axis of rotation, all points along any annulus of the wafer (at any arbitrary radius) are exposed to the same amount of radiation. By providing a number of pyrometers and a feedback system, even the remaining radial temperature dependence can be removed, and good temperature uniformity achieved and maintained across the entire substrate.

In mechanical rotation systems, such as those sold by Applied Materials, Inc., of Santa Clara, Calif., the substrate support is rotatably mounted on a bearing assembly that is, in turn, coupled to a vacuum-sealed drive assembly. Certain details of such systems are provided in U.S. Pat. No. 5,155,336, entitled "Rapid Thermal Heating Apparatus and Method", issued Oct. 13, 1992, assigned to the assignee of the present invention, and incorporated herein by reference.

For example, FIG. 1A depicts such a system. A wafer 12 is placed on an edge ring 14, which is in turn friction-fit on a cylinder 16. Cylinder 16 sits on a ledge of an upper bearing race 21 which is magnetic. Upper bearing race 21 is disposed within well 39 and revolves, by virtue of a number of ball bearings 22 (only one of which is shown), relative to a lower bearing race 26. Lower bearing race 26 is mounted generally at a chamber bottom 28.

A water-cooled reflector 24 is positioned on chamber bottom 28 as part of the temperature measuring system (details of which are not shown). Reflector 24 reflects radiant energy from heating lamps (not shown) back towards the wafer for efficient heating. Reflector 24 is advantageously used as one side of a reflecting cavity. The other sides of the reflecting cavity are formed by cylinder 16 and wafer 12. The highly reflective properties of reflector 24 allow precise temperature measurements of wafer 12. A magnet 30 is located adjacent the portion of chamber bottom 28 opposite upper magnetic bearing race 21. The magnet is mounted on a motor-driven magnet ring 32.

One problem with rotating substrates during processing is that unstable gas paths, referred to here as "vortices", may be produced. These vortices may occur when process gases traverse from a region over the rotating substrate to a non-rotating region adjacent the substrate, or vice-versa. These vortices may in turn cause other unstable gas paths in unpredictable directions. These unstable gas paths often lead to film nonuniformity.

For example, referring to FIG. 1B, when substrate 12 supported by edge ring 14 on cylinder 16 rotates, the process gases are viscously pulled along substrate 12. When the process gases impinge on a non-rotating portion of the chamber, represented schematically here by element 35, a counter-rotating vortex may be set up by the ensuing unstable gas flow. The steady state reached may be as shown in the figure, with the process gases' path shown by arrow 37 and the counter-rotating vortex indicated by arrows 36. This situation causes an undesirable ring of deposition 38 to occur on window 33 because the hot process gases impinge on window 33 before they can cool, causing condensation. The point at which condensation occurs is often the point at which the two gas paths meet, shown in FIG. 1B as a dotted line.

The above system has other disadvantages. For example, it is commonly seen that the sliding and rolling contact associated with ball bearings leads to particle generation in the processing chamber. This particle generation arises from the contact between the ball bearings and the races as well as from the necessary use of lubrication for the bearing system.

A related disadvantage occurs when gaseous products of the chemical reactions on the wafer are not fully exhausted via a pumping system. Some amount of these gases may escape the pumping system and undesirably flow to regions below the plane of the wafer. For example, a typical silicon deposition may occur by the reaction of trichlorosilane (TCS) and molecular hydrogen ($H_2$) in a processing region above the wafer. Occasionally, some of the process gases may leak to the region below the wafer due to imperfections in the edge ring supporting the wafer or due to incomplete coverage of the edge ring by the wafer. The leaked gases are then bounded in a cylindrical region which may range from about five to twenty millimeters (mm) high, which is the approximate distance between the wafer and the reflector located beneath the wafer. The temperature at the top boundary of this region (the wafer) may be equal to or greater than 1100° C. The temperature at the bottom boundary of this region (the reflector surface) is typically about 150° C. Under these conditions and this thermal gradient, it is commonly noted that trapped TCS gas is converted to silicon chloride (SiCl$_2$) and hydrogen chloride (HCl) gases. These gases tend to form undesirable deposits on the cooled reflector surface due to condensation. Such deposits deleteriously affect the temperature measurement of the wafer. Undesirable deposits also occur on the backside of the wafer.

Other regions which may be so affected include the region forming the remainder of the well containing the bearing/race system. Many of the sensitive components relating to rotation may be located in this well. In particular, damage and corrosion may be caused to the bearings and the exterior of the cylinder by the presence of hot gases in these regions.

A further problem associated with present rotational systems concerns heating of those components nearest the wafer. These components, such as upper bearing race 21 (FIG. 1A), receive large amounts of radiant heat from the heating lamp system, and are heated to a substantial fraction of the temperature achieved by wafer 12. Gases which may have adsorbed onto upper bearing race 21 during prior depositions may be outgassed by the heat and thus form the source of potential contaminants.

Thus, it would be useful to provide a processing system that eliminates or reduces the effect of some, if not all, of these problems.

SUMMARY OF THE INVENTION

In one aspect, the invention is directed to an apparatus to isolate a rotating frame in a processing chamber, comprising: a support cylinder rotatably extending from the rotating frame; and a co-rotating edge ring extension extending from the support cylinder to at least one of substantially thermally, optically and/or mechanically isolate the region above the co-rotating edge ring extension from the region below the co-rotating edge ring extension.

Implementations of the invention may include one or more of the following. The support cylinder and the co-rotating edge ring extension are made of quartz. The co-rotating edge ring extension may extend from a first circumferential flange on the support cylinder. The co-rotating edge ring extension may engage the first circumferential flange with a friction-fit. The support cylinder may further include a second circumferential flange to at least one of substantially thermally, optically, and mechanically isolate the region above the second circumferential flange from the region below the second circumferential flange. The support cylinder may further comprise a third circumferential flange for engaging a rotor, the third circumferential flange frictionally engaging the rotor through a plurality of locator pins which may be friction-fit to the rotor.

In another aspect, the invention is directed to an apparatus for isolating a first region above a rotating frame in a processing chamber from a second region, comprising: a support cylinder rotatably extending from the rotating frame; and a co-rotating edge ring extension extending from the support cylinder to form a barrier for gases to restrict gas flow between the first region and the second region.

In a further aspect, the invention is directed to an apparatus for substantially isolating a portion of a semiconductor processing chamber, comprising: a rotating frame; a co-rotating edge ring extension extending away from the rotating frame and having an axis of symmetry substantially collinear with an axis of symmetry of the rotating frame, wherein the shape of the co-rotating edge ring extension is conical and a surface thereof forms a predetermined angle with the axis of symmetry of the co-rotating edge ring extension.

Implementations of the invention may include one or more of the following. The co-rotating edge ring extension may have a frustal cross-section. A support cylinder may be located between the rotating frame and the co-rotating edge ring extension, such that the co-rotating edge ring extension extends from the support cylinder. An edge ring may be provided for supporting a substrate, the edge ring connected to the support cylinder. The co-rotating edge ring extension may extend substantially to a wall of the semiconductor processing chamber.

In a further aspect, the invention is directed to a semiconductor processing chamber having a processing region above a rotating substrate. The chamber includes a rotating frame mounted in a housing; a support cylinder rotatably joined to the rotating frame; and an edge ring extending from an end of the support cylinder opposite that joined to the rotating frame. The edge ring is configured to support a substrate. The system further comprises means for rotating the rotating frame. A co-rotating edge ring extension extends away from the edge ring and has an axis of symmetry substantially collinear with an axis of symmetry of the edge ring. The region above the co-rotating edge ring extension is at least one of substantially thermally, optically, and mechanically isolated from the region below the co-rotating edge ring extension.

Implementations of the invention may include one or more of the following. The support cylinder and the co-rotating edge ring extension may be made of quartz.

In a further aspect, the invention is directed to a method for substantially isolating one portion of a semiconductor processing chamber from another during processing. The method comprises the steps of providing a rotating frame; joining a support cylinder to the frame for rotation therewith; joining an edge ring to an end of the support cylinder opposite that joined to the frame so as to support a substrate; and extending a co-rotating edge ring extension from the support cylinder such that an axis of symmetry of the co-rotating edge ring extension is substantially collinear with an axis of symmetry of the support cylinder.

Implementations of the invention may include one or more of the following. A purge gas may be flowed in a cavity defined partially by the support cylinder. Further steps may include flowing a process gas into the chamber, and heating the substrate.

In a further aspect, the invention is directed to a method for reducing the occurrence of multiple gas vortices in a semiconductor processing chamber. The method comprises the steps of providing a rotating frame mounted in a housing and joining a support cylinder to the frame for rotation therewith. An edge ring is joined to an end of the support cylinder opposite that joined to the frame so as to support a substrate. A co-rotating edge ring extension is extended from the support cylinder such that an axis of symmetry of the co-rotating edge ring extension is substantially collinear with an axis of symmetry of the support cylinder. A portion of any process gases within the chamber flows from the surface of the substrate to and substantially along the surface of the co-rotating edge ring extension.

In yet a further aspect, the invention is directed to a method for reducing the temperature of process gases in a semiconductor processing chamber so as to reduce deposition of process gases on a wall of the chamber. The method comprises the steps of providing a rotating frame mounted in a housing; joining a support cylinder to the frame for rotation therewith; joining an edge ring to an end of the support cylinder opposite that joined to the frame so as to support a substrate; and extending a co-rotating edge ring extension from the support cylinder such that an axis of symmetry of the co-rotating edge ring extension is substantially collinear with an axis of symmetry of the support cylinder. A portion of the process gases within the chamber flows from the surface of the substrate to and substantially along the surface of the co-rotating edge ring extension, whereby the temperature of the process gases is reduced by contact with the co-rotating edge ring extension.

In another aspect, the invention is directed to a method for reducing thermal losses to an edge ring in a semiconductor processing chamber. The method comprises the steps of providing a rotating frame mounted in a housing; joining a support cylinder to the frame for rotation therewith; joining an edge ring to an end of the support cylinder opposite that joined to the frame so as to support a substrate; and extending a co-rotating edge ring extension from the support cylinder. An axis of symmetry of the co-rotating edge ring extension is substantially collinear with an axis of symmetry of the support cylinder. The thermal mass of the co-rotating edge ring extension reduces thermal losses of the edge ring.

It is an advantage of the present invention that substantial isolation of the rotational components may be achieved optically, thermally and mechanically from the reactive gases and radiation in the processing region of an RTP chamber. A more stable and less turbulent gas flow is achieved. Heat loss to cooled components is reduced, and the formation of undesirable particulates on the chamber walls and windows is reduced.

Other advantages and features of the present invention will become apparent from the following description, including the drawings and claims.

BRIEF DESCRIPTION OF THE DRAWINGS

FIG. 1A is a cross-sectional view of a prior art bearing and rotation system used in an RTP chamber.

FIG. 1B is a schematic view showing gas flow dynamics in the rotational system of FIG. 1A.

FIG. 2 is a cross-sectional view of an RTP chamber according to an embodiment of the present invention.

FIG. 3 is an exploded perspective view of a portion of the rotor system for use with the present invention, showing in particular a barrier or co-rotating edge ring extension according to an embodiment of the present invention.

FIG. 4 is a cross-sectional view showing details of the system.

FIG. 5 is an enlarged view of a portion of FIG. 4.

FIG. 6 is another enlarged view of a portion of FIG. 4 showing gas flow directions.

DETAILED DESCRIPTION

The present invention relates to a barrier for use in thermochemical processing chambers and in particular the RTP apparatus disclosed in U.S. patent application Ser. No. 08/359,302, entitled "Method and Apparatus for Measuring Substrate Temperatures", filed Dec. 19, 1994, assigned to the assignee of the present invention, and which is incorporated herein by reference. The barrier provides for at least one of thermal, mechanical and optical isolation of the region below the barrier from the region above. Here, mechanical isolation refers to serving as a physical barrier to restrict gas particle passage from one region to another.

FIG. 2 shows such an RTP processing chamber 100 for processing a disk-shaped, twelve-inch (300 mm) diameter silicon (Si) substrate 117. The substrate 117 is mounted inside chamber 100 on a rotor system 111 and is heated by a heating element 110 located directly above substrate 117. Heating element 110 generates radiation 112 which may enter processing chamber 100 through a water-cooled quartz window assembly 114. The window assembly may be located approximately 25 mm above the substrate. Beneath substrate 117 is a reflector 153 which is mounted on a central assembly 151 having a generally cylindrical base. Reflector 153 may be made of aluminum and has a highly reflective surface coating 120. A reflector cover 155 (shown in FIGS. 5–7) may be used to protect the reflector. Certain details of such a reflector cover are disclosed in U.S. Patent Application entitled "Reflector Cover for a Semiconductor Processing Chamber", to D. S. Ballance et al., filed on even date herewith, assigned to the assignee of the present invention, and incorporated herein by reference. An underside 165 of substrate 117 and the top of reflector 153 form a reflecting cavity 118 for enhancing the effective emissivity of the substrate.

The separation between substrate 117 and reflector 153 is variable. In processing systems that are designed for twelve-inch silicon wafers, the distance between substrate 117 and reflector 153 may be between about 3 mm and 20 mm, and more particularly between about 5 mm and 8 mm. The width-to-height ratio of cavity 118 should be larger than about 20:1.

The temperatures at localized regions 102 of substrate 117 are measured by a plurality of temperature probes (only three of which are shown in FIG. 2). Each temperature probe includes a sapphire light pipe 126 that is inserted into a conduit 124 that passes from the backside of central assembly 151 through the top of reflector 153. Sapphire light pipes 126 may be about 0.080 inch in diameter and conduits 124 are slightly larger to enable the light pipes to be easily inserted into the conduits. Light pipes 126 are connected to pyrometers 128 via fiber optics 125 which produce a signal indicative of the measured temperature.

A processing region 163 is located generally above substrate 117. In processing region 163, and to a certain extent in other areas of the chamber, process gases are used in conjunction with the temperature control of substrate 117 via lamps 110 to conduct chemical reactions on substrate 117. These reactions include, but are not limited to, oxidation, nitridation, film growth, etc. The process gases typically emerge into processing region 163 through a gas plenum or showerhead located above or to the side of processing region 163. In FIG. 2, these gases enter from a gas inlet 177. If necessary, process gases may be pumped out of the chamber or exhausted by a pumping system 179 of known design.

Substrate 117 is generally a large diameter silicon wafer. Wafers of other materials may also be used. As noted above, the embodiment discussed here is for a 300 mm wafer, but the invention contemplates a rotational drive for any size wafers, including 200 mm, 450 mm, as well as for wafers of lesser or greater sizes.

Central assembly 151 includes a circulation circuit including chambers 146 fed by coolant inlets 185 (see FIG. 5) through which a coolant such as a cooled gas or liquid circulates, thereby cooling reflector 153.

Substrate 117 is disposed on an edge ring 119 which is mounted on a support cylinder 115. Support cylinder 115 is coupled to a rotating frame such as rotor 113. The co-rotating edge ring extension 121 of the present invention also extends from edge ring 119. Co-rotating edge ring extension 121 may also be made integral with edge ring 119. Edge ring 119, support cylinder 115, co-rotating edge ring extension 121, and rotor 113 are the primary components of rotor system 111.

On the inside region of edge ring 119 is a shelf 134 for supporting substrate 117. Shelf 134 is a region around the inside circumference of edge ring 119 that is lower than the rest of edge ring 119. On this shelf, edge ring 119 contacts the substrate around the substrate's outer perimeter, thereby leaving all of an underside 165 of substrate 117 exposed except for a small annular region about the outer perimeter.

Edge ring 119, located partially adjacent substrate 117, is subject to corrosion due to its proximity to processing region 163 where reactive gases deposit material on substrate 117. Edge ring 119 is resistant to such corrosion.

Edge ring 119 is designed to create a light-tight seal with support cylinder 115. Edge ring 119 has a cylindrically-shaped lip or skirt 109 with an outside diameter that is slightly larger than the outside diameter of support cylinder 115 so that lip 109 fits over support cylinder 115 and forms a light-tight seal. Of course, skirt 109 may connect to support cylinder 115 in a number of other ways as well.

As edge ring 119 has an outer radius that is larger than the radius of support cylinder 115, it extends radially beyond support cylinder 115. This annular extension of edge ring 119 beyond support cylinder 115 functions as a baffle which partially prevents stray light from entering reflecting cavity 118. To further reduce the possibility of stray light entering reflecting cavity 118, edge ring 119, including lip 109, may be coated with a material that absorbs the radiation generated by heating element 110 (e.g., silicon). The absorption should be chosen to occur at least in the wavelength range of the pyrometers, e.g., 0.8 to about 1.1 microns. To further reduce the amount of stray light entering cavity 118, the co-rotating edge ring extension 121 of the present invention may be used as described below.

Support cylinder 115 may be made, for example, of quartz. It may be coated with Si to also render it opaque in the frequency range of pyrometers 128, particularly in the range of about 0.8 to about 1.1 microns. The Si coating on support cylinder 115 acts as a baffle to block out radiation from external sources that might contaminate the pyrometer temperature measurement.

Rotor 113 is the component upon which a rotational force acts to rotate rotor system 111. For example, a magnetic levitation system may be used to perform the rotation. A magnetic field generated by a stator assembly 127 having permanent magnets (for lift) and electromagnets (for control). Together they may act to levitate rotor system 111 as described in U.S. patent application entitled "Magnetically Levitated Rotor System for an RTP Chamber", filed on even date, assigned to the assignee of the present invention, and incorporated herein by reference. The stator and magnet system may be of the type described in U.S. patent application Ser. No. 08/548,692, entitled "Integrated Magnetic Levitation and Rotation System", to Stephen Nichols, et al., assigned to Satcon, Inc., which is incorporated herein by reference. The present invention is described with respect to such a system, however, the present invention may be advantageously used with any type of rotational system having a rotating frame or a rotating bearing, including those described in the other applications and patents incorporated herein by reference. For example, a race and bearing system is a type of rotational system that may be used in the context of the present invention.

Still referring to FIG. 3, support cylinder 115 has a first flange 104, a second flange 143 and a third flange 106. While not strictly required, first flange 104 and second flange 143 may be advantageously offset in the vertical direction so that support cylinder 115 maintains a narrow local cross-section. While each flange is described in more detail below, it is here noted that first flange 104 supports co-rotating edge ring extension 121; second flange 143 extends towards a reflector sidewall 122 (shown, e.g., in FIGS. 5–6) to permit a minimum clearance between the two; and third flange 106 is used to frictionally-mount support cylinder 115 to rotor 113. The second flange 143 at least one of substantially thermally, optically and mechanically isolates the region above the second flange from the region below the second flange.

The overall system described above is provided in a cross-sectional view in FIG. 4.

Referring to the expanded cross-sectional view of FIG. 5, the circulation circuit and chambers 146 extract heat from thin wall 129, stator assembly 127, and rotor 113. In particular, heat may be removed from these components by radiation to chambers 146. This is especially important with respect to rotor 113 because, as rotor 113 is levitated, it is difficult to cool through conventional methods. A purge gas may be provided, as discussed below, to enhance conduction of heat from rotor 113 to chambers 146.

Third flange 106 of support cylinder 115 frictionally engages a plurality of flexible locator pins 123 that are friction-fit mounted in a plurality of holes in an upper periphery surface 113*a* of rotor 113. Locator pins 123 may be made of, for example, TEFLON® (PTFE) or VESPEL®. One design that has been found acceptable uses four locator pins 123. Each locator pin 123 has a locator pin O-ring 105 encircling it, generally at its narrowest portion. O-ring 105 strengthens and stiffens locator pin 123 against overly large deflections. Each locator pin 123 is secured by a pin plug 159, an equal number of which are disposed generally equidistantly around top circular periphery 113*a* of rotor 113. Pin plug 159 is friction-fit inserted in a non-threaded manner into a corresponding hole in the top surface of rotor 113.

By the engagement of third flange 106 with locator pins 123, support cylinder 115 is supported on rotor 113 in a secure but flexible manner. The plurality of holes in surface 113*a* forms a circle whose radius is generally larger than the radius of support cylinder 115. Rotation of rotor 113 results in a corresponding rotation of support cylinder 115. The friction-fit of third flange 106 by means of locator pins 123 is tight enough that support cylinder 115 does not slip or skip on locator pins 123 as rotor 113 is brought up to operating speed.

The use of locator pins 123 ensures that support cylinder 115 does not rotate in an eccentric manner during processing. As noted before, rotor 113 is heated during processing. Thus, it expands and its diameter increases. The locator pins 123, which are flexible, allow for this expansion.

Referring to FIG. 6, and with particular reference to the co-rotating edge ring extension 121 according to an embodiment of the present invention, first flange 104 is used as a support for co-rotating edge ring extension 121. Co-rotating edge ring extension 121 has a generally frustal-conical shape, and extends radially outwards from first flange 104 towards the side of chamber 100. In particular, first flange 104 has an integral edge 104*a* onto which co-rotating edge ring extension 121 is placed. The co-rotating edge ring extension may have the shape of a frustrum in cross-section.

Co-rotating edge ring extension 121 may have an axis of symmetry that is substantially collinear with an axis of symmetry of edge ring 119 and rotor 113. The surface 121a of co-rotating edge ring extension 121 forms a predetermined angle with its axis of symmetry. This angle may be in the range of about 0° to about 30°, and may be in particular 11°. The frictional fit of co-rotating edge ring extension 121 on first flange 104 ensures that co-rotating edge ring extension 121 will rotate with support cylinder 115 without skipping or slipping.

One feature of co-rotating edge ring extension 121 is related to prevention of buildup of undesirable deposits on the walls of chamber 100. Co-rotating edge ring extension 121 may have a large thermal mass as it may extend almost to the walls of chamber 100. Generally, for co-rotating edge ring extensions 121 having a constant distance from the wall of chamber 100, a larger $t$ means a larger thermal mass. Moreover, the greater the thickness of co-rotating edge ring extension 121, the larger is the thermal mass.

Co-rotating edge ring extension 121 prohibits deposition on components such as, for example, a water-cooled stainless steel bearing cover 161. This bearing cover protects components below it, such as thin wall 129, from corrosion. The above deposition instead may occur on co-rotating edge ring extension 121 because of hot process gases that may come near or be in contact with co-rotating edge ring extension 121. Because of the larger thermal mass, the poor absorption of infrared energy by quartz, and the proximity of co-rotating edge ring extension 121 to bearing cover 161, which is water-cooled, the hot process gases may tend to cool as they near or come in contact with co-rotating edge ring extension 121. Since cooler gases are less likely to deposit on the wall of chamber 100 (because high temperatures are required for most gas deposition chemistries), co-rotating edge ring extension 121 inhibits build-up of deposits on chamber walls and tends to keep chamber 100 clean.

Another way in which deposition is prevented is by cooling the hot process gases. FIG. 6 shows a general gas flow path indicated by arrow 200. As hot process gases are viscously pulled along substrate 117 and co-rotating edge ring extension 121, they are cooled by contact with these surfaces. For example, at a typical process temperature of about 1100° C., the temperature of the gases at a location indicated by location 201 may be about 1100° C. At location 202, at the perimeter of edge ring 119, the gases may have cooled to about 1000° C. As the gases flow towards and on co-rotating edge ring extension 121, they cool even more. For example, at location 203, the gases may have cooled to about 700° C. and at location 204, near the edge of co-rotating edge ring extension 121, the gases may have cooled to about 300° C., well below a temperature required for deposition on the walls of the chamber.

Co-rotating edge ring extension 121 extends over bearing cover 161. The clearance between co-rotating edge ring extension 121 and bearing cover 161 below it is small, and may be in the range of about 0.030 to 0.120 inches. Thus, bearing cover 161 is subject to less radiation 112 because it is covered by co-rotating edge ring extension 121. As bearing cover 161 is maintained at a cooler temperature, it is in turn subject to less diffusion and outgassing of contaminants which may be present in, on, or near it. This assists in maintaining the cleanliness of chamber 100.

By means of the limited clearance between co-rotating edge ring extension 121 and bearing cover 161, the amount of process gases, heat and radiation is substantially attenuated from processing region 163 down to the region near the lower part of cylinder 115 and rotor 113.

Co-rotating edge ring extension 121 may be made of quartz or other materials such as graphite, silicon carbide, ceramics, etc. By constructing co-rotating edge ring extension 121 of such materials, it may not absorb a large amount of the radiant energy of the lamps. This may be important because such absorption may heat co-rotating edge-ring extension 121 which would increase vaporization of hot reactive species from its surface back into process region 163, as well as cause heating of bearing cover 161 beneath it.

During the heating cycle, co-rotating edge ring extension 121 may tend to reach a steady-state temperature according to the processing parameters. Co-rotating edge ring extension 121, at this steady-state temperature, reduces undesirable heating losses from, e.g., substrate 117 and edge ring 119. In particular, it is noted that substrate 117 and edge ring 119 may lose heat to water-cooled reflector 153 and bearing cover 161. The thermal mass of co-rotating edge ring extension 121 reduces such losses.

Of course, according to the demands of the process, it may be desirable to have the lamps heat co-rotating edge ring extension 121. For example, in a short growth process where little or no deposition would occur on the walls and where deposition is to be actively discouraged on co-rotating edge ring extension 121, such heating may be desirable. In this case, co-rotating edge ring extension 121 may be made out of, e.g., graphite.

Co-rotating edge ring extension 121 reduces deposition from the process gases which may continuously flow during fabrication steps. In particular, co-rotating edge ring extension 121 allows a smooth gas path from the center of substrate 117 to the outer wall of chamber 100 because it spins (or co-rotates) along with and at the same speed as substrate 117. In this way, multi-directional vortices in the gas flow are avoided and replaced with a single flow vortex because the hot process gases in the vortex impinge on a minimum of non-rotating components prior to their exhaust from the system. The ensuing smooth gas flow has at least three advantages. First, it may result in a more uniform deposition on substrate 117. Second, it may tend to reduce contaminant particle generation in chamber 100 which sometimes occurs with multi-directional vortex generation. This particle generation occurs because gas maintained at or near the ideal deposition temperature may experience "gas-phase nucleation" where a small particle acts as a "substrate" and grows larger as material deposits on it.

In another feature, co-rotating edge ring extension 121 provides a degree of stiffness to support cylinder 115 in order to prevent out-of-round distortions. In particular, and as mentioned above, support cylinder 115 may be primarily constituted of a thin quartz material and may be subjected to deleterious process conditions and high rotational speeds. To avoid distortions of support cylinder 115, it is advantageous to provide the same with areas of enhanced strength and stiffness. Co-rotating edge ring extension 121 assists in providing this significant degree of strength.

In another advantageous feature of co-rotating edge ring extension 121, particles and outgassing which emerge from the volume of rotor well 116 near thin wall 129 may be reduced. These particles and gases may cause deleterious effects on substrate 117 if allowed to contact substrate 117 during processing. Co-rotating edge ring extension 121 causes such particles and gases to travel a far more circuitous path to reach processing region 163. Thus, a far fewer number of such particles emerge into processing region 163. To the extent any such particles do emerge, they may be rapidly swept away by exhaust gas port 183 and removed by pumping system 179. In particular, any particles which emerge from rotor well 116 do so near exhaust gas port 183, and are thus easily swept away.

As shown in FIGS. 4–5, a purge gas may be introduced into cavity 118 through a purge gas inlet or injector 147. Purge gas inlet 147 is connected to a gas supply (not shown). Additional details regarding the purge gas system may be found in U.S. patent application entitled "Method and Apparatus for Purging the Back Side of a Substrate During Chemical Vapor Processing" to Deaton et al., filed on even date herewith, assigned to the assignee of the present application and incorporated herein by reference.

The purge gas may be introduced into cavity 118. Referring to FIG. 6, the purge gas path is shown by first gas path arrow 175. This purge gas flows downward between reflector sidewall 122 and support cylinder 115. The purge gas then flows down towards central assembly 151 and rotor 113. The purge gas then flows around rotor 113 and up adjacent thin wall 129. The gas then flows between bearing cover 161 and co-rotating edge ring extension 121. In so doing, the purge gas is viscously pulled along co-rotating edge ring extension 121. The high rotational speed of co-rotating edge ring extension 121 assists in this effect. The purge gas then enters a gas exhaust port 183 and is removed by pumping system 179. In the case where some of the purge gas leaks from cavity 118 to processing region 163 due to, e.g., imperfections in edge ring 119, these gases may also be pulled along co-rotating edge ring extension 121 and removed.

This purge gas ensures that a continuous back-pressure is maintained so that deposition does not occur on backside 165 of substrate 117. A suitable back-pressure may be about 100 milliTorr, although this pressure varies according to the process.

The present invention has been described in terms of preferred embodiments. The invention, however, is not limited to the embodiment depicted and described. Rather, the scope of the invention is defined by the appended claims.

What is claimed is:

1. An apparatus to isolate a rotating frame in a processing chamber, comprising:
   a support cylinder rotatably extending from said rotating frame; and
   a co-rotating edge ring extension extending from said support cylinder toward a wall of the processing chamber and away from a substrate positioned to be processed in the processing chamber to substantially thermally, optically or mechanically isolate the region above said co-rotating edge ring extension from the region below said co-rotating edge ring extension.

2. The apparatus of claim 1, wherein said support cylinder and said co-rotating edge ring extension are made of quartz.

3. An apparatus to isolate a rotating frame in a processing chamber, comprising:
   a support cylinder rotatably extending from said rotating frame;
   a co-rotating edge ring extension extending from a first circumferential flange on said support cylinder to at least one of substantially thermally, optically and mechanically isolate the region above said co-rotating edge ring extension from the region below said co-rotating edge ring extension; and
   said support cylinder further including a second circumferential flange to at least one of substantially thermally, optically, and mechanically isolate the region above said second circumferential flange from the region below said second circumferential flange.

4. The apparatus of claim 3, wherein said co-rotating edge ring extension engages said first circumferential flange with a friction-fit.

5. The apparatus of claim 3, wherein said support cylinder further comprises a third circumferential flange for engaging a rotor, said third circumferential flange frictionally engaging said rotor through a plurality of locator pins.

6. The apparatus of claim 5, wherein said locator pins are friction-fit to said rotor.

7. An apparatus for substantially isolating a portion of a semiconductor processing chamber, comprising:
   a rotating frame;
   a co-rotating edge ring extension extending away from said rotating frame and having an axis of symmetry substantially collinear with an axis of symmetry of said rotating frame; and
   wherein the shape of said co-rotating edge ring extension is conical and a surface thereof forms a predetermined angle with said axis of symmetry of said co-rotating edge ring extension.

8. The apparatus of claim 7, wherein said co-rotating edge ring extension has the shape of a frustrum in cross-section.

9. The apparatus of claim 7, further comprising a support cylinder located between said rotating frame and said co-rotating edge ring extension, such that said co-rotating edge ring extension extends from said support cylinder.

10. The apparatus of claim 9, further comprising an edge ring for supporting a substrate, said edge ring connected to said support cylinder.

11. The apparatus of claim 7, wherein said co-rotating edge ring extension extends substantially to a wall of said semiconductor processing chamber.

12. A semiconductor processing chamber having a processing region above a rotating substrate, comprising:
   a rotating frame mounted in a housing;
   a support cylinder rotatably joined to said rotating frame;
   an edge ring extending from an end of said support cylinder opposite that joined to said rotating frame, said edge ring configured to support a substrate;
   means for rotating said rotating frame;
   a co-rotating edge ring extension extending from said end of said support cylinder and away from said edge ring toward a wall of the semiconductor processing chamber and having an axis of symmetry substantially collinear with an axis of symmetry of said edge ring; and
   wherein said co-rotating edge ring extension is constructed and positioned to at least one of substantially thermally, optically, and mechanically isolate the region below said co-rotating edge ring extension from the region above said co-rotating edge ring extension.

13. The apparatus of claim 12, wherein said co-rotating edge ring extension has the shape of a frustrum in cross-section.

14. The apparatus of claim 12, wherein said support cylinder and said co-rotating edge ring extension are made of quartz.

15. An apparatus for isolating a first region above a rotating frame in a processing chamber from a second region, comprising:
   a support cylinder rotatably extending from said rotating frame; and a co-rotating edge ring extension extending from said support cylinder toward a wall of the processing chamber and away from a substrate positioned to be processed in the processing chamber to form a barrier for gases to restrict gas flow between said first region and said second region.

16. A method for substantially isolating one portion of a semiconductor processing chamber from another during processing, comprising the steps of:

providing a rotating frame;

joining a support cylinder to said frame for rotation therewith;

joining an edge ring to an end of said support cylinder opposite that joined to said frame so as to support a substrate; and extending a conically-shaped co-rotating edge ring extension from said support cylinder such that an axis of symmetry of said co-rotating edge ring extension is substantially collinear with an axis of symmetry of said support cylinder.

17. The method of claim 16, further comprising the step of flowing a purge gas in a cavity defined partially by said support cylinder.

18. The method of claim 16, further comprising:

flowing a process gas into said chamber; and heating said substrate.

19. A method for reducing the temperature of process gases in a semiconductor processing chamber so as to reduce deposition of process gases on a wall of said chamber, comprising the steps of:

providing a rotating frame mounted in a housing;

joining a support cylinder to said frame for rotation therewith;

joining an edge ring to an end of said support cylinder opposite that joined to said frame so as to support a substrate; and extending a co-rotating edge ring extension from said support cylinder toward a wall of said chamber and away from a substrate positioned on said edge ring such that an axis of symmetry of said co-rotating edge ring extension is substantially collinear with an axis of symmetry of said support cylinder, such that a portion of the process gases within said chamber flows from the surface of said substrate to and substantially along the surface of said co-rotating edge ring extension, whereby the temperature of the process gases is reduced by contact with said co-rotating edge ring extension.

20. A method for reducing thermal losses to an edge ring in a semiconductor processing chamber, comprising the steps of:

providing a rotating frame mounted in a housing;

joining a support cylinder to said frame for rotation therewith;

joining an edge ring to an end of said support cylinder opposite that joined to said frame so as to support a substrate; and extending a co-rotating edge ring extension from said support cylinder toward a wall of the semiconductor processing chamber and away from a substrate positioned on said edge ring such that and an axis of symmetry of said co-rotating edge ring extension is substantially collinear with an axis of symmetry of said support cylinder, such that the thermal mass of said co-rotating edge ring extension reduces thermal losses of said edge ring.

21. A method for reducing the occurrence of multiple gas vortices in a semiconductor processing chamber, comprising the steps of:

providing a rotating frame mounted in a housing;

joining a support cylinder to said frame for rotation therewith;

joining an edge ring to an end of said support cylinder opposite that joined to said frame so as to support a substrate;

extending a co-rotating edge ring extension from said support cylinder toward a wall of said processing chamber and away from a substrate positioned on said edge ring such that an axis of symmetry of said co-rotating edge ring extension is substantially collinear with an axis of symmetry of said support cylinder; and such that a portion of any process gases within said processing chamber flows from the surface of the substrate to and substantially along the surface of said co-rotating edge ring extension.

22. A method for substantially isolating one portion of a semiconductor processing chamber from another during processing, comprising the steps of:

providing a rotating frame;

joining a support cylinder to said frame for rotation therewith;

extending a co-rotating edge ring extension from an end of said support cylinder opposite that joined to said frame toward a wall of the processing chamber and away from a substrate positioned in the processing chamber to be processed such that an axis of symmetry of said co-rotating edge ring extension is substantially collinear with an axis of symmetry of said support cylinder and such that the said co-rotating edge ring extension substantially thermally, optically or mechanically isolates the region above said co-rotating edge ring extension from the region below said co-rotating edge ring extension.

* * * * *